(12) United States Patent
Frohberg et al.

(10) Patent No.: US 7,608,501 B2
(45) Date of Patent: Oct. 27, 2009

(54) TECHNIQUE FOR CREATING DIFFERENT MECHANICAL STRAIN BY FORMING A CONTACT ETCH STOP LAYER STACK HAVING DIFFERENTLY MODIFIED INTRINSIC STRESS

(75) Inventors: Kai Frohberg, Niederau (DE); Carsten Peters, Dresden (DE); Matthias Schaller, Dresden (DE); Heike Salz, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 342 days.

(21) Appl. No.: 11/425,942

(22) Filed: Jun. 22, 2006

(65) Prior Publication Data
US 2007/0077708 A1 Apr. 5, 2007

(30) Foreign Application Priority Data
Sep. 30, 2005 (DE) .................. 10 2005 046 978

(51) Int. Cl.
*H01L 21/8238* (2006.01)
(52) U.S. Cl. ............... 438/229; 438/199; 438/970; 257/E21.63
(58) Field of Classification Search ............ 438/199, 438/229, 224, 230, 231, 970; 257/E21.63
See application file for complete search history.

(56) References Cited

U.S. PATENT DOCUMENTS

| 6,573,172 | B1 | 6/2003 | En et al. ............. 438/626 |
| 7,482,219 | B2 * | 1/2009 | Frohberg et al. ....... 438/224 |
| 2003/0181005 | A1 | 9/2003 | Hachimine et al. ..... 438/231 |
| 2004/0104405 | A1 * | 6/2004 | Huang et al. .......... 257/199 |
| 2005/0093030 | A1 | 5/2005 | Doris et al. ........... 257/288 |
| 2005/0214998 | A1 | 9/2005 | Chen et al. ........... 438/199 |
| 2007/0249113 | A1 * | 10/2007 | Grudowski et al. ..... 438/199 |

FOREIGN PATENT DOCUMENTS

DE 102004052578 A1 5/2006

* cited by examiner

*Primary Examiner*—Walter L Lindsay, Jr.
(74) *Attorney, Agent, or Firm*—Williams, Morgan & Amerson, P.C.

(57) ABSTRACT

By partially removing an etch stop layer prior to the formation of a first contact etch stop layer, a superior stress transfer mechanism may be provided in an integration scheme for generating strain by means of contact etch stop layers. Thus, a semiconductor device having different types of transistors may be provided, in which a high degree of metal silicide integrity as well as a highly efficient stress transfer mechanism is achieved.

13 Claims, 13 Drawing Sheets

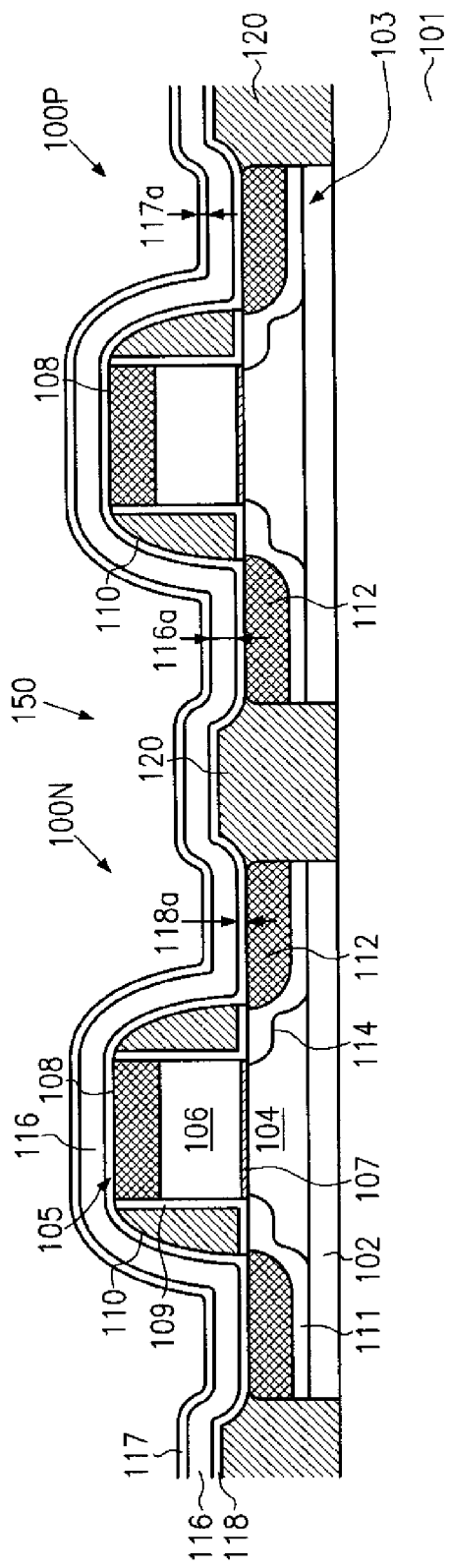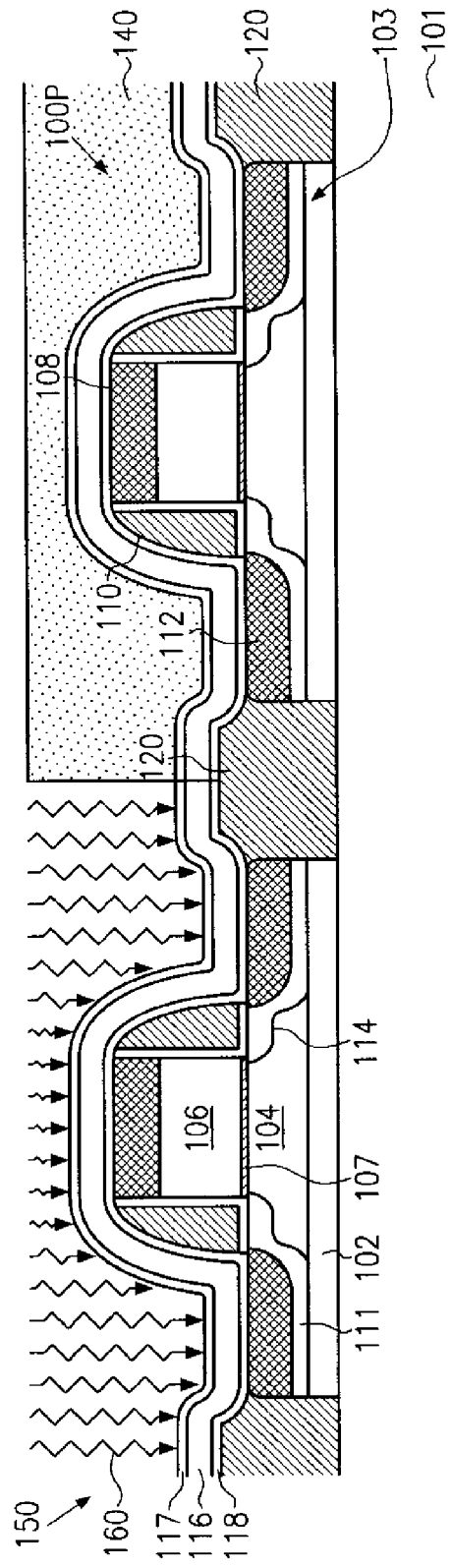
Fig.1a (prior art)
Fig.1b (prior art)

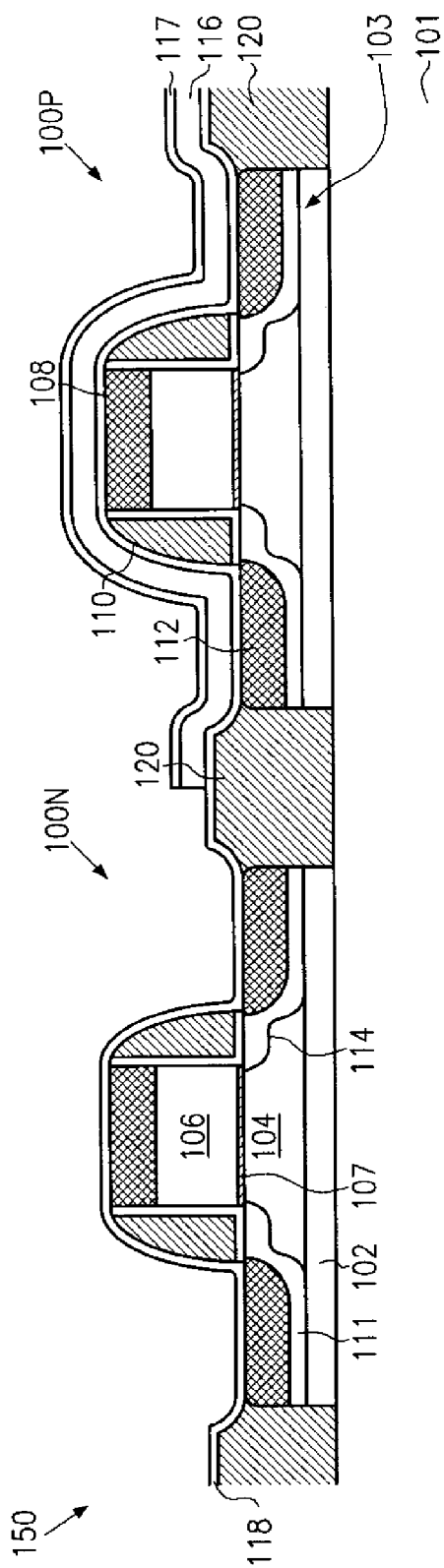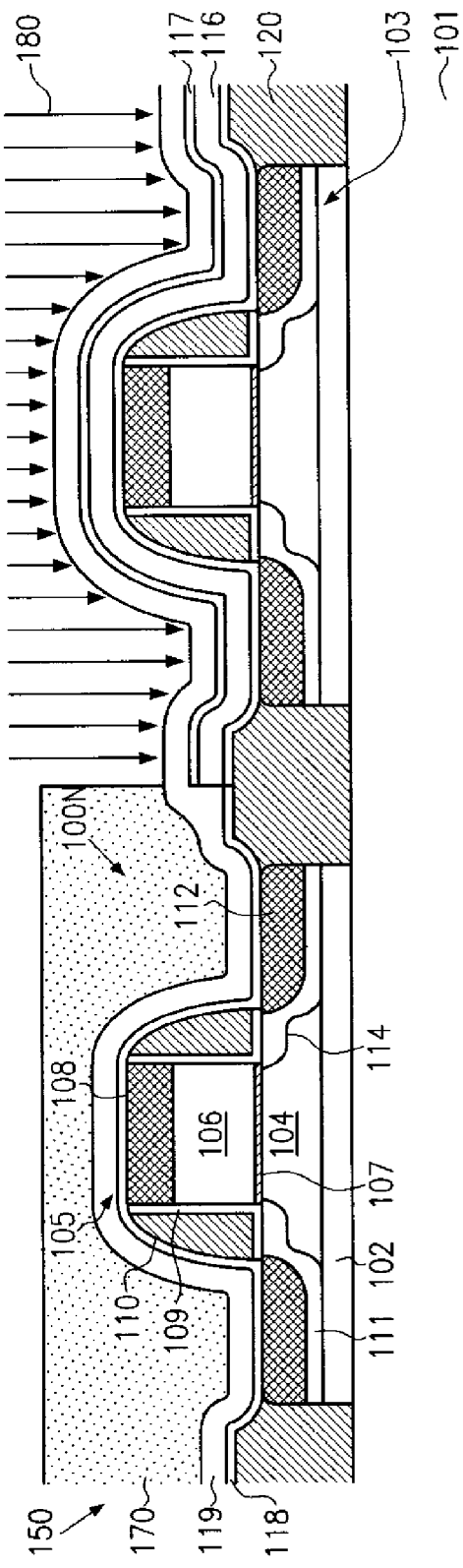

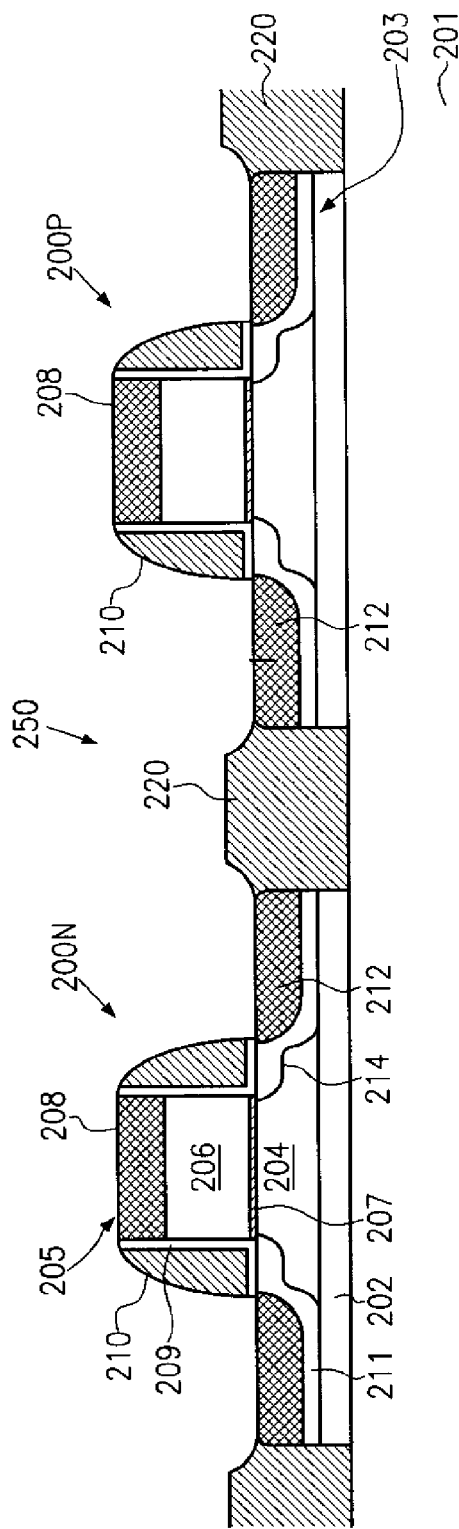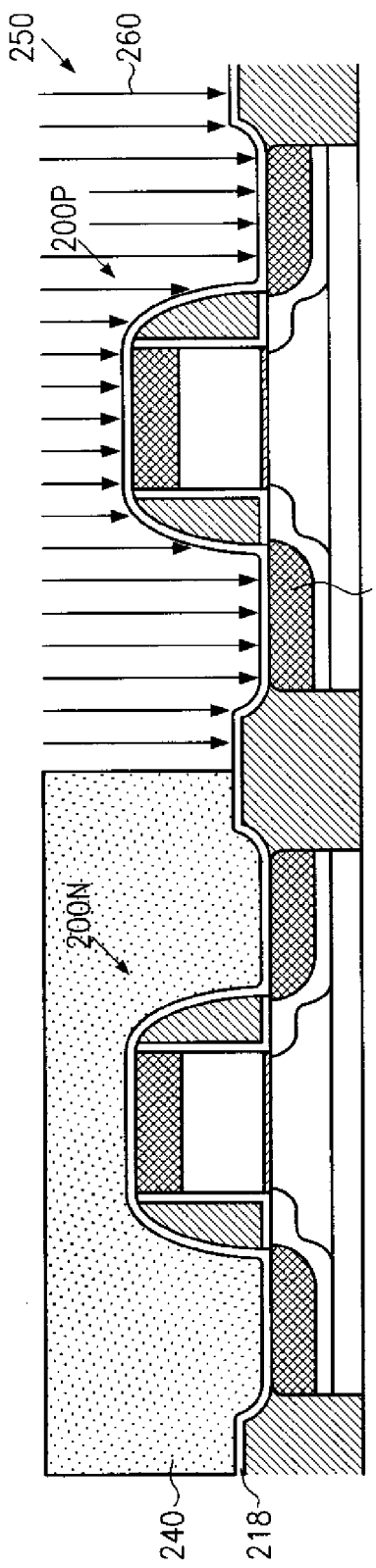
Fig. 2a
Fig. 2b

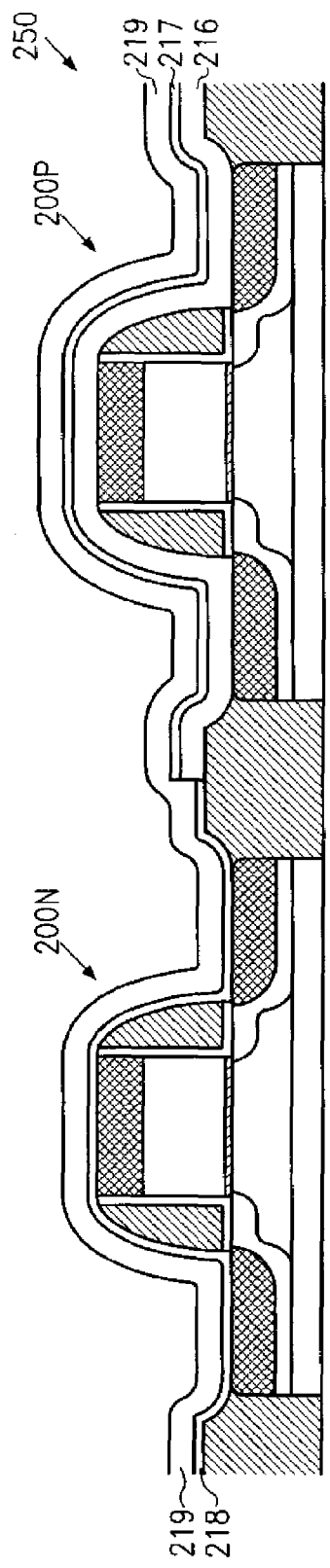
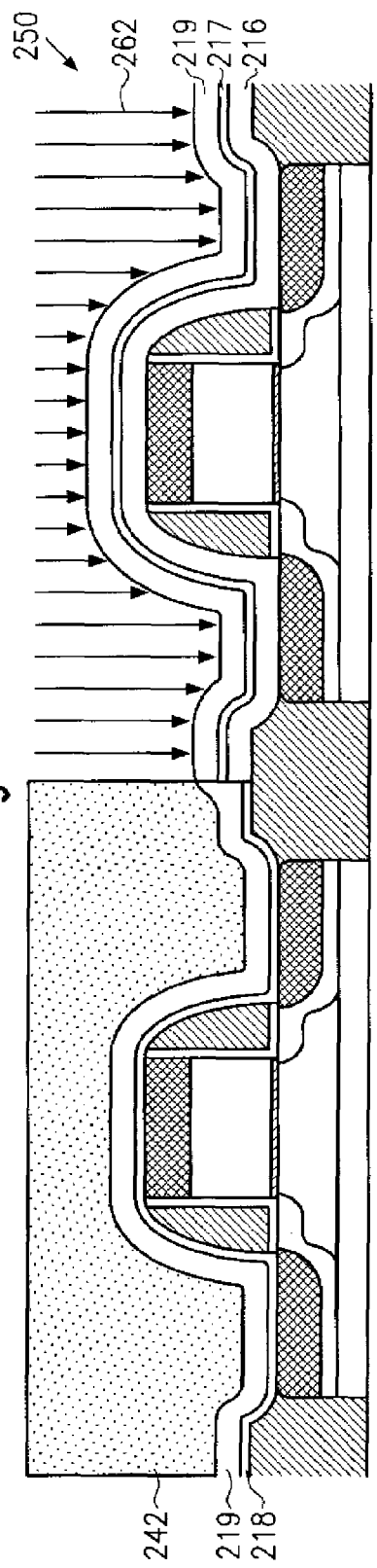

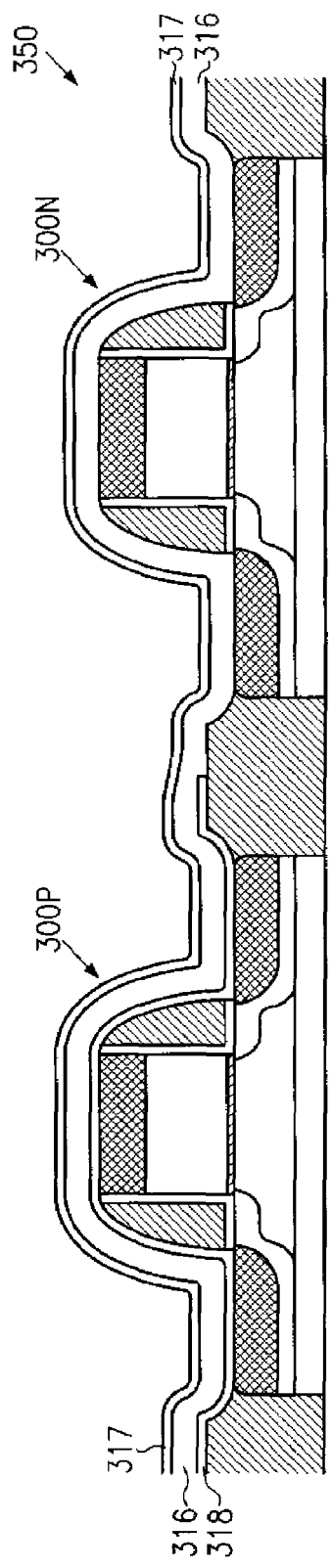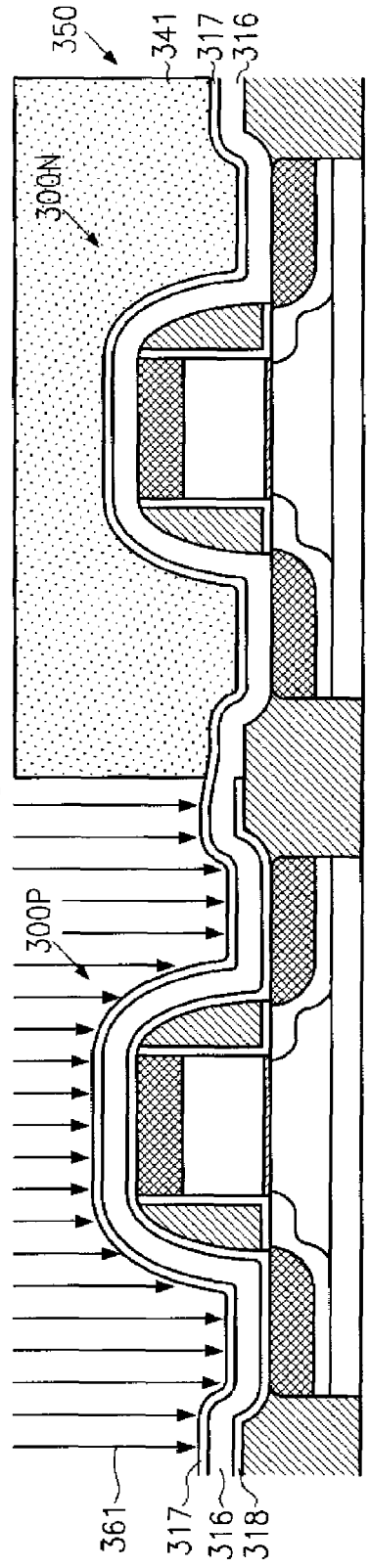

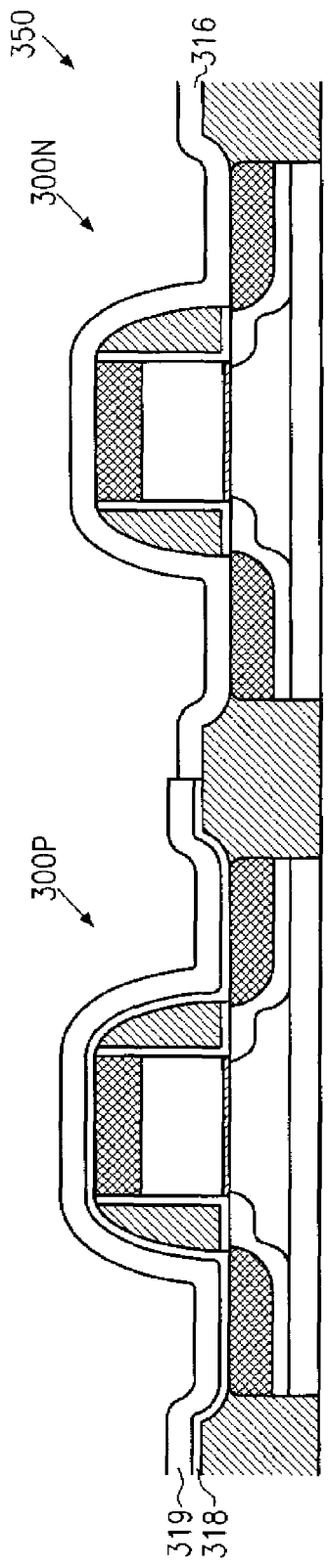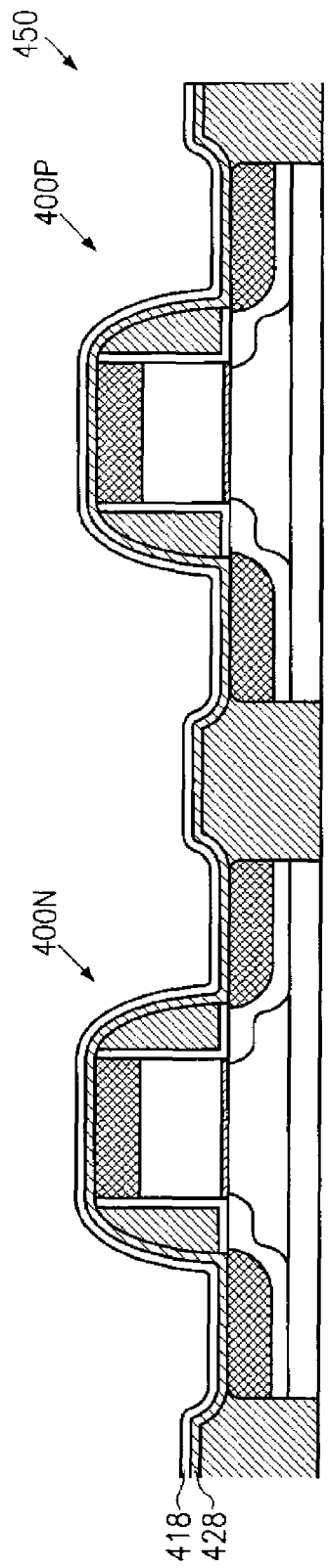

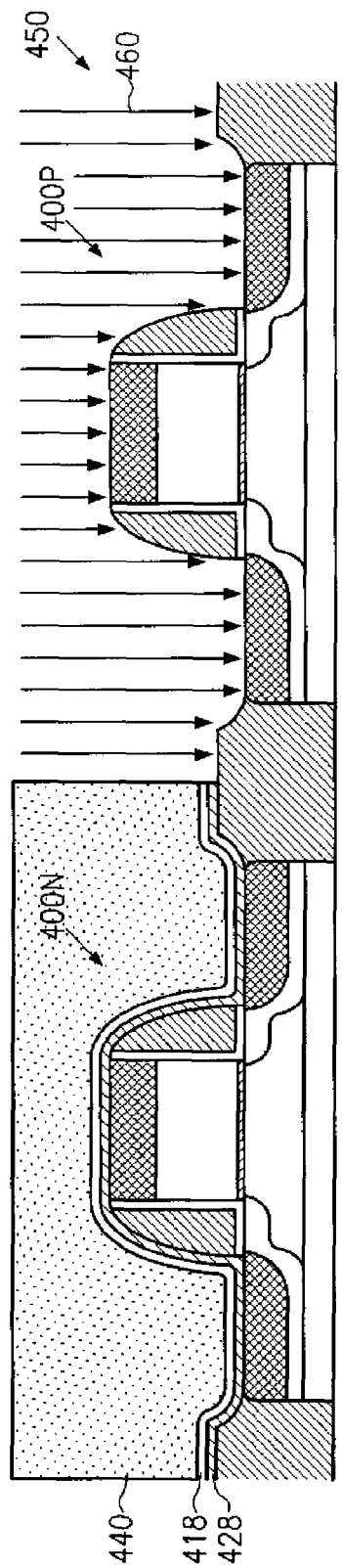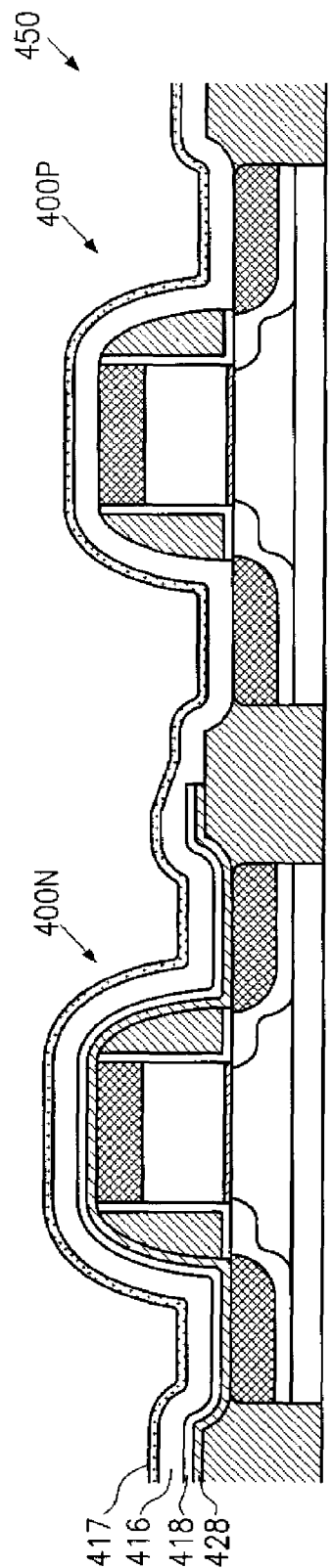
Fig.4b
Fig.4c

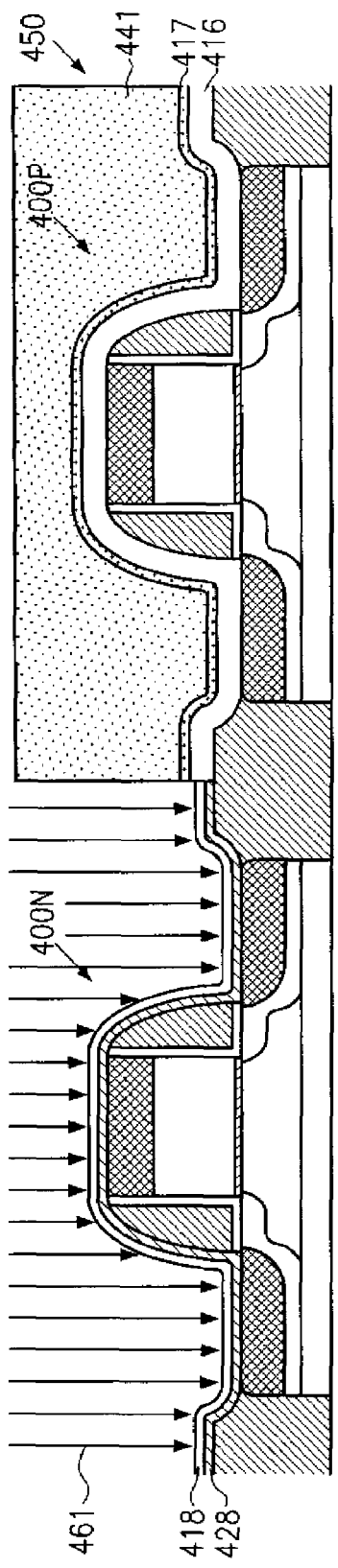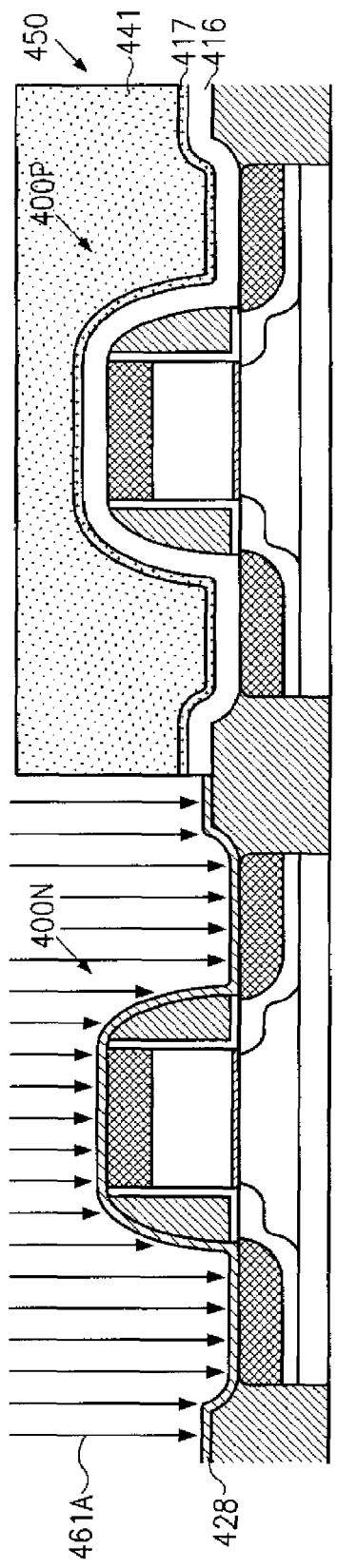
Fig.4d
Fig.4e

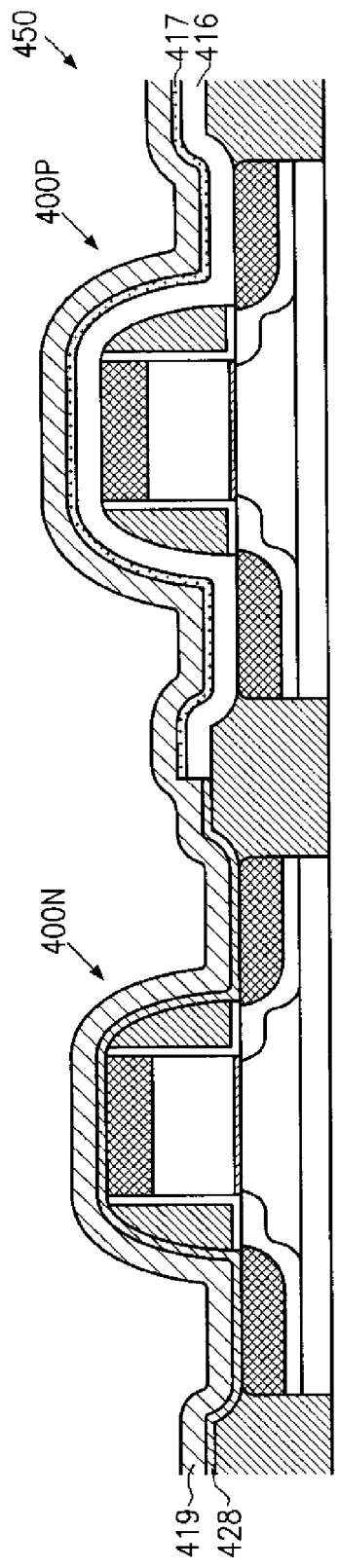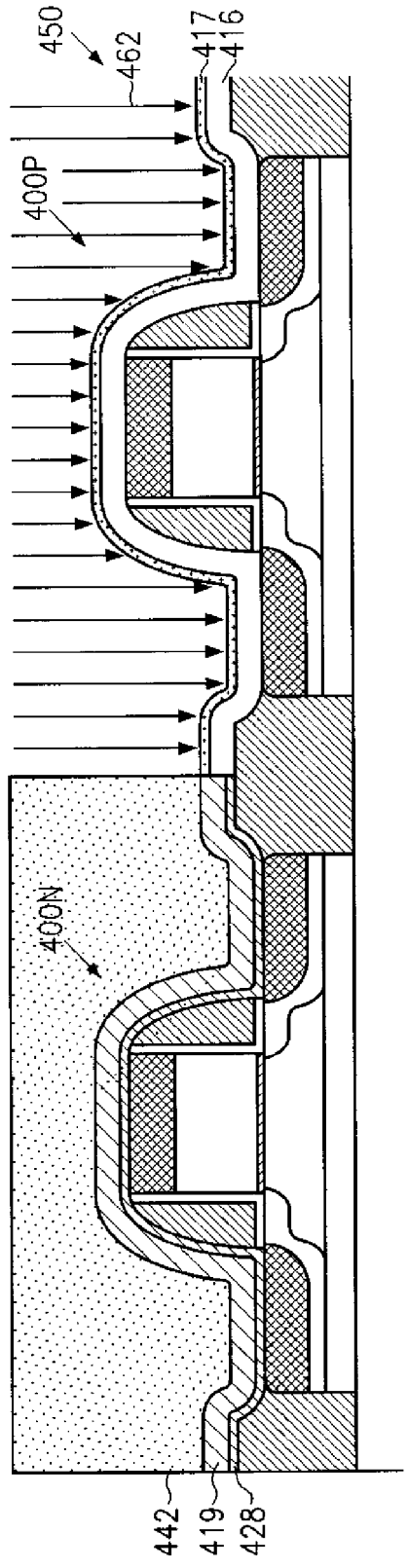
Fig.4f
Fig.4g

TECHNIQUE FOR CREATING DIFFERENT MECHANICAL STRAIN BY FORMING A CONTACT ETCH STOP LAYER STACK HAVING DIFFERENTLY MODIFIED INTRINSIC STRESS

BACKGROUND OF THE INVENTION

1. Field of the Invention

Generally, the present invention relates to the formation of integrated circuits, and, more particularly, to the formation of field effect transistors having a channel region with a specified intrinsic strain so as to improve the charge carrier mobility.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, substantially depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially influences the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control, since reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Since the continuous size reduction of the critical dimensions, i.e., the gate length of the transistors, necessitates great efforts for the adaptation and possibly the new development of process techniques concerning the above-identified process steps, it has been proposed to also enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive strain, which results in a modified mobility for electrons and holes, respectively. For example, creating tensile strain in the channel region increases the mobility of electrons, wherein, depending on the magnitude of the tensile strain, an increase in mobility of up to 120% may be obtained, which, in turn, may directly translate into a corresponding increase in the conductivity. On the other hand, compressive strain in the channel region may increase the mobility of holes, thereby providing the potential for enhancing the performance of P-type transistors. Therefore, in some conventional approaches, for instance, a silicon/germanium layer or a silicon/carbon layer is provided in or below the channel region to create tensile or compressive strain therein. Although the transistor performance may be considerably enhanced by the introduction of strain-creating layers in or below the channel region, significant efforts have to be made to implement the formation of corresponding layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

In other approaches, stress from an etch stop layer, that is required on top of the transistors to control a contact etch process, is used to induce strain in the channel regions of the transistors, wherein compressive strain is created in the P-channel transistor, while tensile strain is created in the N-channel transistor. However, this conventional approach, although offering substantial performance advantages, may bring about some drawbacks that may partially offset the benefits accomplished by the enhanced strain engineering, as will be described with reference to FIGS. 1a-1d.

FIG. 1a schematically shows a cross-sectional view of a semiconductor device 150 comprising a first transistor 100N and a second transistor 100P. The transistors 100N, 100P represent different types of transistor elements, such as an N-channel transistor and a P-channel transistor. Although the transistors 100N and 100P differ in their conductivity type, for convenience, the transistors shown have substantially the same configuration and hence corresponding components of the transistors 100N, 100P may be denoted by the same reference numerals, wherein it should be borne in mind that typically any doped regions in one of the transistors 100N, 100P are inversely doped in the other transistor.

The semiconductor device 150 comprises a substrate 101 having formed thereon an insulating layer 102, which may be a buried silicon dioxide layer, a silicon nitride layer and the like, followed by a crystalline semiconductor layer 103 or active layer, which may be a silicon layer. The first and second transistors 100N, 100P may be separated from each other by an isolation structure 120, which may be provided, for instance, in the form of a shallow trench isolation. The first and second transistors 100N, 100P further comprise a gate electrode structure 105 including a semiconductor portion 106, such as a polysilicon portion, and a metal-containing portion 108 that is provided, for instance, in the form of a metal silicide. The gate electrode structure 105 further comprises a gate insulation layer 107 separating the gate electrode structure 105 from a channel region 104, which in turn laterally separates appropriately doped source and drain regions 111 which include corresponding extension regions 114. Moreover, metal silicide regions 112 may be formed in the drain and source regions 111. A spacer element 110 is formed adjacent to the sidewalls of the gate electrode structure 105 and may be separated therefrom by a liner 109. The second transistor 100P may have substantially the same configuration, wherein the channel region 104 and the drain and source regions 111 may include different dopants compared to the respective regions of the transistor 100N.

Moreover, the semiconductor device 150 comprises a first liner or etch stop layer 118 and a second or contact etch stop layer 116 formed above the first etch stop layer 118. The contact etch stop layer 116 is typically formed of silicon nitride having a specific intrinsic stress, whereas the etch stop layer 118 is formed of a different material, such as silicon dioxide, having a high etch selectivity with respect to an etch process for removing a portion of the layer 116, as will be described later on. A thickness of the etch stop layer 118, referred to as 118a, is significantly less compared to a thickness 116a of the contact etch stop layer in order to reduce any deleterious effects of the etch stop layer 118 with respect to the stress transfer efficiency from the contact etch stop layer 116 into the channel region of the transistor 100P when the contact etch stop layer 118 is formed to have a compressive stress. Moreover, the semiconductor device 150 comprises a further etch stop layer 117 formed on the contact etch stop layer 116, which may be comprised of silicon dioxide.

A typical conventional process flow for forming the semiconductor device 150 as shown in FIG. 1a may comprise the following processes. The substrate 101 and the transistors 100N, 100P may be formed according to well-established process techniques, including, for instance, well-established trench isolation techniques for forming the isolation structures 120, followed by a sequence for forming and patterning a gate insulation material and a gate electrode material by means of advanced deposition and/or oxidation, photolithography and etch techniques. Thereafter, implantation sequences and, intermittently, spacer formation techniques may be applied to form the corresponding drain and source regions 111 including the extensions 114 on the basis of one or more spacer elements, such as the spacers 110. Finally, the metal silicide regions 108 and 112 may be formed on the basis of well-established techniques. Thereafter, the first etch stop layer 118 may be formed by depositing silicon dioxide on the basis of, for instance, plasma enhanced chemical vapor deposition (PECVD). Next, the contact etch stop layer 116 may be deposited, for instance, in the form of a silicon nitride layer, wherein the intrinsic stress of the layer 116 may be adjusted by controlling one or more of the deposition parameters, such as the gas mixture, the deposition rate, the temperature and the ion bombardment during the deposition process, in accordance with known techniques. For example, a compressive stress may be obtained up to approximately 1.5 GPa on the basis of well-established process recipes. Thereafter, the etch stop layer 117 is deposited as a silicon dioxide liner.

FIG. 1b schematically shows the device 150 with a resist mask 140 formed thereon, wherein the resist mask 140 covers the transistor 100P while exposing the transistor 100N and the corresponding portions of the layers 118, 116 and 117. Moreover, an etch process 160 is applied in order to remove the exposed portions of the layers 117 and 116. For this purpose, the etch process 160 may comprise a first etch step to etch through the etch stop layer 117 on the basis of a wet chemical process, for instance with diluted fluoric acid, or on the basis of a plasma etch process. Thereafter, the etch process 160 is continued on the basis of an etch chemistry that exhibits a desired high degree of selectivity with respect to the contact etch stop layer 116 and the etch stop layer 118.

FIG. 1c schematically shows the semiconductor device 150 after completion of the etch process 160 and after removal of the resist mask 140. Moreover, any cleaning processes may have been performed to reduce any material residues stemming from the preceding processes. Hence, the device 150 comprises the first etch stop layer 118 above the transistor 100N, so that undue material loss or erosion of the underlying metal silicide regions 108 and 112 during the preceding removal of the layer portion 117 may be effectively suppressed. On the other hand, the second transistor 100P comprises the remaining portion of the contact etch stop layer 116 having the compressive intrinsic stress, thereby inducing a corresponding compressive strain within the channel region 104 in the transistor 100P.

FIG. 1d schematically shows the device 150 in a further advanced manufacturing stage, wherein a second contact etch stop layer 119 is formed above the device that has an intrinsic tensile stress. The second contact etch stop layer 119 is typically comprised of silicon nitride that has been formed by specified process conditions to provide the desired tensile stress therein. Moreover, the semiconductor device 150 has formed thereon a resist mask 170, which covers the first transistor 100N and exposes the second transistor 100P, and thus the respective layers 119, 117, 116 and 118 formed thereabove. In order to reduce undue deleterious effects of the tensile stress of the second contact etch stop layer 119 on the P-channel transistor 100P and to obtain substantially identical conditions during a contact etch in a further advanced manufacturing stage, in which the first and second contact etch stop layers 116 and 119 are used as etch stop layers, the device 150 is subjected to an etch process 180 that is designed to remove the portion of the second contact etch stop layer 119 that is not covered by the resist mask 170. Since well-established selective etch recipes for etching silicon nitride selectively to silicon dioxide are available, the second contact etch stop layer 119 formed above the transistor 100P may be reliably removed without undue damage of the first contact etch stop layer 116 due to the presence of the etch stop layer 117. Thus, the non-removed portion of the layer 119 may provide tensile strain in the transistor 100N, while the first contact etch stop layer 116 may still provide the desired compressive strain in the channel region of the transistor 100P.

However, in highly scaled transistor elements, the stress transfer mechanism has to be highly efficient to result in the desired compressive or tensile strain in the respective channel regions. Consequently, the remaining etch stop layer 118, which is highly advantageous in avoiding undue metal silicide erosion, may, however, significantly reduce stress transfer into the respective channel regions, thereby rendering a conventional technique less efficient.

In view of the above-described situation, there exists a need for an alternative technique that enables the creation of different strain in different transistor elements, while substantially avoiding or reducing effects of at least some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the creation of desired strain within the channel regions of transistor elements by providing different types of stress-inducing contact etch stop layers above the respective transistor elements, wherein a high degree of integrity of metal silicide regions is maintained while an enhanced stress transfer mechanism is still provided, in that at least one transistor type may be directly in contact with the respective contact etch stop layer.

According to one illustrative embodiment of the present invention, a method comprises selectively forming a first etch stop layer above one of a first transistor element and a second transistor element. Moreover, a first contact etch stop layer is formed above the first and second transistor elements, wherein the first contact etch stop layer has a first specified intrinsic stress. The method further comprises selectively removing a portion of the first contact etch stop layer formed above the one of the first and second transistor elements having formed thereabove the first etch stop layer by a selective etch process using the first etch stop layer as an etch stop. Finally, the method comprises forming a second contact etch stop layer above the first and second transistor elements, wherein the second contact etch stop layer has a second intrinsic stress that differs from the first intrinsic stress.

According to another illustrative embodiment of the present invention, a method comprises selectively forming a liner having a first type of intrinsic stress on a first transistor element, while maintaining a second transistor element exposed. Moreover, a first etch stop layer is selectively formed on the liner, while the second transistor element is maintained exposed. Moreover, the method comprises forming a first contact etch stop layer above the first and second transistor elements, wherein the first contact etch stop layer has a second type of intrinsic stress that differs from the first type. Moreover, a portion of the first contact etch stop layer formed above the first transistor element is removed by using the first etch stop layer as an etch stop. Subsequently, the first etch stop layer is removed and a second contact etch stop layer is formed above the first and second transistor elements, wherein the second contact etch stop layer has the first type of intrinsic stress.

According to still another illustrative embodiment of the present invention, a semi-conductor device comprises a first transistor element having a first channel region and a first dielectric layer stack enclosing the first transistor element, wherein the first dielectric layer stack comprises a first etch stop layer, a first contact etch stop layer and an interlayer dielectric, wherein the first dielectric layer stack induces a first type of strain in the first channel region. Moreover, the semiconductor device comprises a second transistor element having a second channel region and a second dielectric layer stack that encloses the second transistor element and comprises a second contact etch stop layer formed on the second transistor element and further comprising the interlayer dielectric, wherein the second dielectric layer stack induces a second type of strain in the second channel region and wherein the second type of strain differs from the first type of strain.

BRIEF DESCRIPTION OF THE DRAWINGS

The invention may be understood by reference to the following description taken in conjunction with the accompanying drawings, in which like reference numerals identify like elements, and in which:

FIGS. 1a-1d schematically show cross-sectional views of a typical conventional semiconductor device including a complementary transistor pair during various manufacturing stages, wherein the strain in the respective channel regions is generated differently by forming respective contact etch stop layers having different intrinsic stress;

FIGS. 2a-2h schematically show cross-sectional views of a semiconductor device including two transistor elements at various manufacturing stages, wherein differently strained channel regions are formed without undue damage of metal silicide regions while providing a highly efficient stress transfer mechanism according to illustrative embodiments of the present invention;

FIGS. 3a-3g schematically show cross-sectional views of a semiconductor device during various manufacturing stages in accordance with still further illustrative embodiments of the present invention; and FIGS. 4a-4g schematically show cross-sectional views of a semiconductor device, in which a highly efficient stress transfer mechanism for both N-type and P-type transistors is provided in accordance with yet further illustrative embodiments of the present invention.

Figure 2C:
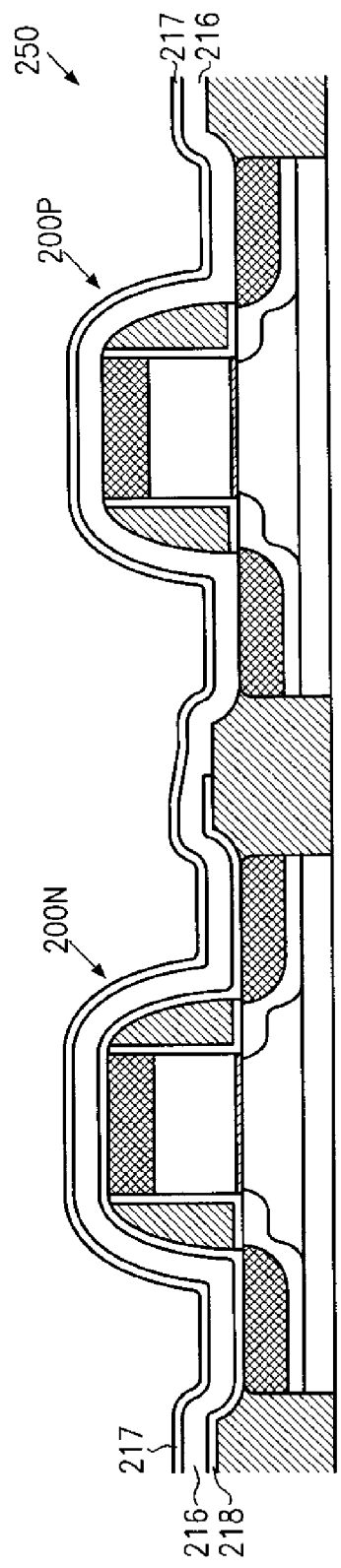

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally the present invention is directed to a technique that allows effective strain engineering in the channel regions of different transistor types by providing differently stressed contact etch stop layers, while at least one transistor element is protected during a selective etch process for removing an unwanted contact etch stop layer portion, while the other transistor may directly receive a corresponding contact etch stop layer without undue material erosion in the metal silicide regions. Consequently, in total, the stress transfer from the contact etch stop layers to the respective channel regions may be enhanced compared to the conventional process flow as previously described, while at the same time a high degree of device integrity with respect to metal silicide erosion may be maintained. With reference to FIGS. 2a-2h, 3a-3g and 4a-4g, further illustrative embodiments of the present invention will now be described in more detail.

FIG. 2a schematically shows a cross-sectional view of a semiconductor device 250 comprising a first transistor element 200N and a second transistor element 200P. The transistor elements 200N, 200P may represent different types of transistor elements, such as an N-channel transistor and a P-channel transistor, or transistors of the same or different types located at very different die locations or substrate locations. In one illustrative embodiment, the transistor 200N may represent an N-channel transistor and the second transistor element 200P may represent a P-channel transistor that may be arranged so as to form a complementary transistor pair. Although the transistors 200N and 200P may differ from each other in size, conductivity type, location, function and the like, for convenience the transistors are shown to have substantially the same configuration and correspondingly respective components of the transistors 200N, 200P are denoted by the same reference signs. It should also be noted that, although the present invention is particularly advantageous for transistor elements without any additional stress inducing components, such as additional epitaxy layers formed in or below the respective channel regions, the present invention may also be combined with such additional strain-creating techniques. It should also be appreciated that, in the following description of further illustrative embodiments, it is referred to transistor elements provided in the form of silicon-on-insulator (SOI) devices with conventional architecture, i.e., without any raised drain and source regions. As will become apparent in the following, the present invention may be applied to transistor elements formed on semiconductive bulk substrates or SOI substrates and may also be readily applied to transistor architectures using raised drain and source regions.

The semiconductor device 250 comprises a substrate 201 having formed thereon an insulating layer 202, when an SOI device is considered, in the form of a buried silicon dioxide layer, a silicon nitride layer and the like, followed by a crystalline semiconductor layer 203, which comprises a significant amount of silicon and may also be referred to as silicon-based layer, since the vast majority of integrated circuits including complex logic circuitry are based on silicon. It should be appreciated, however, that the semiconductor layer 203 may be comprised of any appropriate semiconductor material in accordance with design requirements. In other cases, the substrate 201 may represent a bulk substrate without the insulating layer 202. The first and second transistors 200N, 200P may be separated from each other by an isolation structure 220, which may be provided, for instance, in the form of a shallow trench isolation. The first and second transistors 200N, 200P further comprise a gate electrode structure 205 including a semiconductor portion 206, such as a polysilicon portion, and a metal-containing portion 208 that may be provided, for instance, in the form of a metal silicide.

The gate electrode structure 205 further comprises a gate insulation layer 207 separating the gate electrode structure 205 from a channel region 204, which in turn laterally separates appropriately doped source and drain regions 211, which may include corresponding extension regions 214, wherein metal silicide regions 212 may be formed in the drain and source regions 211. A spacer structure 210 is formed adjacent to the sidewalls of the gate electrode structure 205 and may include one or more liners 209.

The second transistor 200P may have substantially the same configuration, wherein the channel region 204 and the drain and source regions 211 may include different dopants compared to the respective regions of the transistor 200N, when the first and second transistors 200N, 200P represent transistor elements of different conductivity type.

A typical process flow for forming the semiconductor device 250 as shown in FIG. 2a may substantially comprise the same processes as previously described with reference to FIG. 1a, and thus may be formed in accordance with well-established process techniques, which will not be described in detail herein so as to not unduly obscure the principles of the present invention.

FIG. 2b schematically shows the semiconductor device 250 in a further advanced manufacturing stage. Here, a first etch stop layer 218 is formed on the first and second transistors 200N, 200P and, additionally, a resist mask 240 is provided which covers the first transistor 200N while exposing the second transistor 200P, i.e., the exposed portion of the first etch stop layer 218 formed thereon. As previously explained with reference to the first etch stop layer 118 (FIG. 1a), any appropriate deposition techniques, such as PECVD, may be used to form a first etch stop layer 218 with an appropriate thickness and material composition so as to exhibit a moderately high etch selectivity to a contact etch stop layer still to be formed on the portion of the first etch stop layer 218 that is still covered by the resist mask 240. In illustrative embodiments, the first etch stop layer 218 may be formed of silicon dioxide with a thickness of approximately 5-30 nm. In other cases, silicon oxynitride and other material compositions may be used, as long as a sufficient etch selectivity with respect to the material of the subsequently formed contact etch stop layer is achieved. The resist mask 240 may be formed on the basis of a lithography mask as is also used for the formation of the respective drain and source regions for the first and second transistors 200N, 200P, so that no additional design effort is required.

The device 250 is subjected to an etch process 260 for selectively removing the exposed portion of the first etch stop layer 218. For instance, well-established wet chemical or dry etch techniques may be used, wherein a moderately high etch rate may be obtained, which, in combination with the reduced layer thickness of the first etch stop layer 218, may provide high etch selectivity with respect to the underlying metal silicide regions 208 and 212, thereby maintaining any material erosion at a very low level. For example, the wet chemical etch process on the basis of diluted fluoric acid may be used when the first etch stop layer 218 is comprised of silicon dioxide. Since the first etch stop layer 218 is highly uniform in this stage of manufacture, the etch process 260 may also progress highly uniformly, thereby also contributing to a reduced material loss in the regions 208 and 212. Thereafter, the resist mask 240 may be removed and any cleaning processes may be performed to remove contaminations and material residues from the exposed transistor 200P prior to depositing a contact etch stop layer.

FIG. 2c schematically shows the device 250 in a further advanced manufacturing stage, in which a first contact etch stop layer 216 is formed above the first and second transistors 200N, 200P, and an additional second etch stop layer 217 is formed on the first contact etch stop layer 216. In illustrative embodiments, the first contact etch stop layer 216 and the etch stop layer 218 are formed of different materials so as to exhibit a desired high degree of etch selectivity with respect to an etch process that will be described later on. In one embodiment, the first contact etch stop layer 216 may be comprised of silicon nitride, while the first etch stop layer 218 is comprised of silicon dioxide. Moreover, the first contact etch stop layer 216 has a specified intrinsic stress or a specified type of stress, that is, compressive or tensile, which is appropriately selected so as to create a desired degree of strain within the channel region 204 of the second transistor 200P. For example, the contact etch stop layer 216 may have a specified compressive stress when the second transistor 200P represents a P-channel transistor.

As illustrated, a thickness 218a of the first etch stop layer 218 is less than a thickness 216a of the first contact etch stop layer 216, wherein the thickness 218a is sufficient for substantially avoiding or at least significantly reducing any material erosion during a subsequent etch process, while still providing moderately high efficiency of stress transfer. For example, the thickness 216a may range from approximately 20-80 nm for highly scaled semiconductor devices having a gate length, that is, in FIG. 2a, the horizontal extension of the gate electrode 206, of approximately 100 nm and less. In particular embodiments, the gate length of the transistors 200N, 200P may be approximately 50 nm or even less so that a high degree of integrity of the metal silicide regions 208, 212, as well as an efficient stress transfer, is an important factor.

It should be appreciated that any appropriate material combination may be used for the layers 218 and 216, as long as a desired etch selectivity may be achieved while still providing the desired magnitude of intrinsic stress. For instance, amorphous carbon, silicon carbide and the like may be used in combination with silicon dioxide and/or silicon nitride so as to establish an appropriate stress-inducing contact etch stop layer in combination with an underlying etch stop layer.

The second etch stop layer 217, formed above the first contact etch stop layer 216, may be comprised of any appropriate material exhibiting a desired high etch selectivity to a further contact etch stop layer still to be formed, as will be explained later on. In illustrative embodiments, the second etch stop layer 217 may be comprised of silicon dioxide, silicon nitride and the like, depending on the material used for the subsequently formed contact etch stop layer.

Figure 2D:
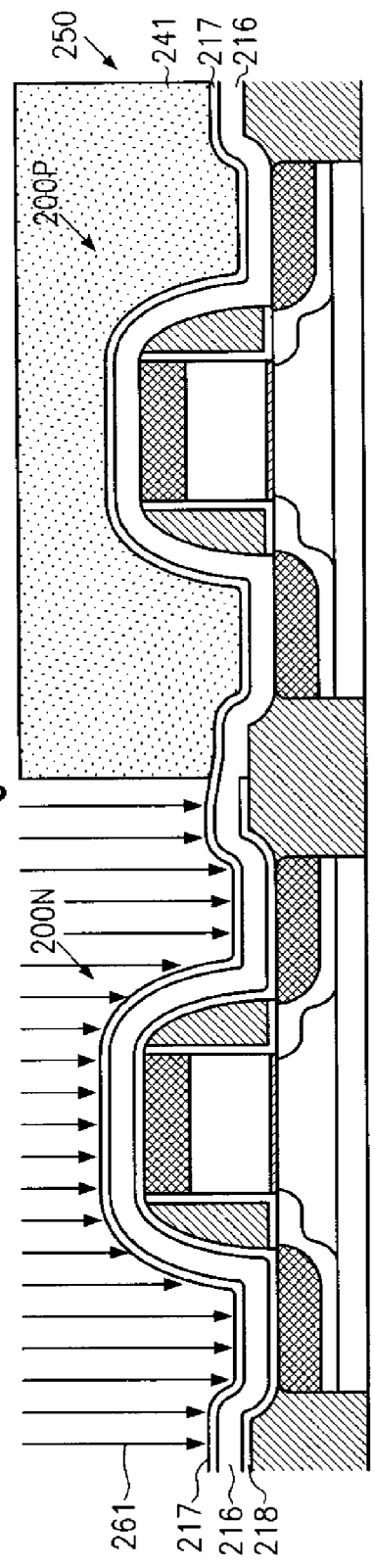

FIG. 2d schematically shows the semiconductor device 250 in a further advanced manufacturing stage. A further resist mask 241 is formed above the device 250 to expose the first transistor 200N, i.e., the layer portions formed thereon, while covering the second transistor 200P, i.e., the layer portions formed thereon. Moreover, the device 250 is subjected to a further etch process 261, which may be designed as any appropriate etch process which may include any other etch steps, wet chemical etch steps, or dry chemical etch steps, for efficiently removing the exposed portion of the layer 217 prior to the actual main etch step for removing the exposed portion of the contact etch stop layer 216. Appropriate etch recipes are well-established in the art and may be used for removing the layer 216, while the process 261 may be controlled on the basis of the first etch stop layer 218, thereby avoiding any undue material erosion in the sensitive metal silicide regions 208 and 212.

FIG. 2e schematically shows the semiconductor device 250 having formed thereon a second contact etch stop layer 219, which may have been formed so as to exhibit a specified second type of intrinsic stress, for instance tensile stress, when the first transistor 200N represents an N-channel transistor. Regarding the material composition of the second contact etch stop layer 219, the same criteria apply as previously explained with reference to the layer 216, wherein advantageously both layers 216 and 219 are formed from a material having substantially the same etch characteristics with respect to an interlayer dielectric material that is to be formed above the layers 216 and 219 later on. In the illustrative embodiment, the second contact etch stop layer 219 may be provided in the form of a silicon nitride layer that has been formed by PECVD on the basis of process parameters so as to establish the desired type and magnitude of intrinsic stress. As previously explained, corresponding recipes for depositing silicon nitride with intrinsic stress ranging from approximately 1.5 GPa compressive stress to approximately 1.5 GPa tensile stress are well established in the art.

FIG. 2f schematically shows the device 250 in a further advanced manufacturing stage, wherein a resist mask 242 is formed above the device 250 to cover the first transistor element 200N while exposing the second transistor element 200P, i.e., the layer portions formed thereon. Moreover, the device 250 is subjected to an etch process 262, which may be a plasma-based etch process for removing the exposed portion of the second contact etch stop layer 219. Due to the provision of the second etch stop layer 217, the etch process 262 may be reliably controlled, wherein well-established process recipes may be used to reliably stop the etch process 262 on or within the etch stop layer 217. Thereafter, the resist mask 242 may be removed.

Figure 2G:
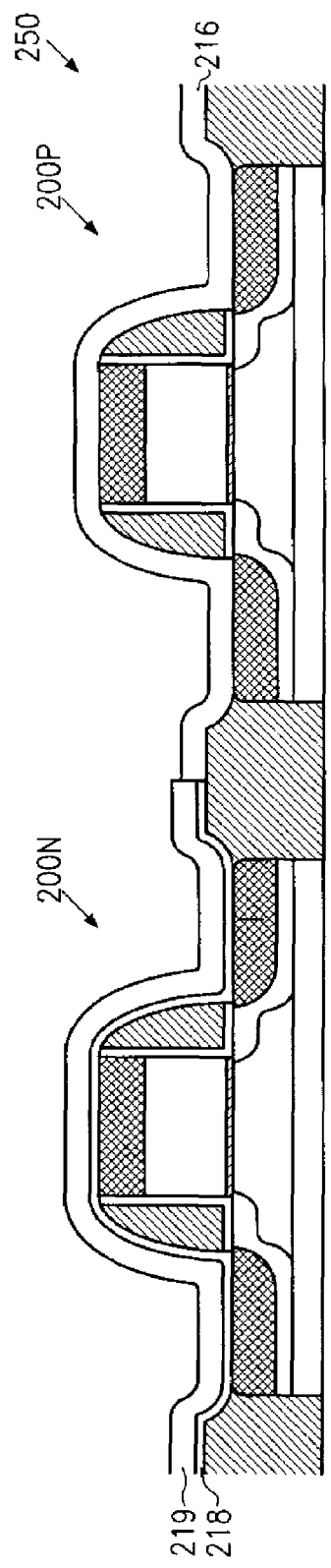

FIG. 2g schematically shows the semiconductor device 250 after the completion of the above-described process sequence. Consequently, the second transistor 200P, which, in the present embodiment, represents a P-channel transistor, is directly in contact with the first contact etch stop layer 216, thereby providing a superior stress transfer mechanism into the respective channel region 204 so as to create compressive strain therein. The first transistor 200N, in this embodiment representing an N-channel transistor, has formed thereabove the second contact etch stop layer 219 having the tensile stress with the first etch stop layer 218 formed between sensitive device areas, such as the metal silicide regions 208 and 212, thereby reducing any undue material erosion during the previously performed etch process 261 (FIG. 2d). Thus, a highly efficient stress transfer mechanism, in combination with a high degree of device integrity, may be provided. Thereafter, the manufacturing process may be continued in accordance with well-established techniques so as to form an interlayer dielectric material and corresponding contact openings therein.

Figure 2H:
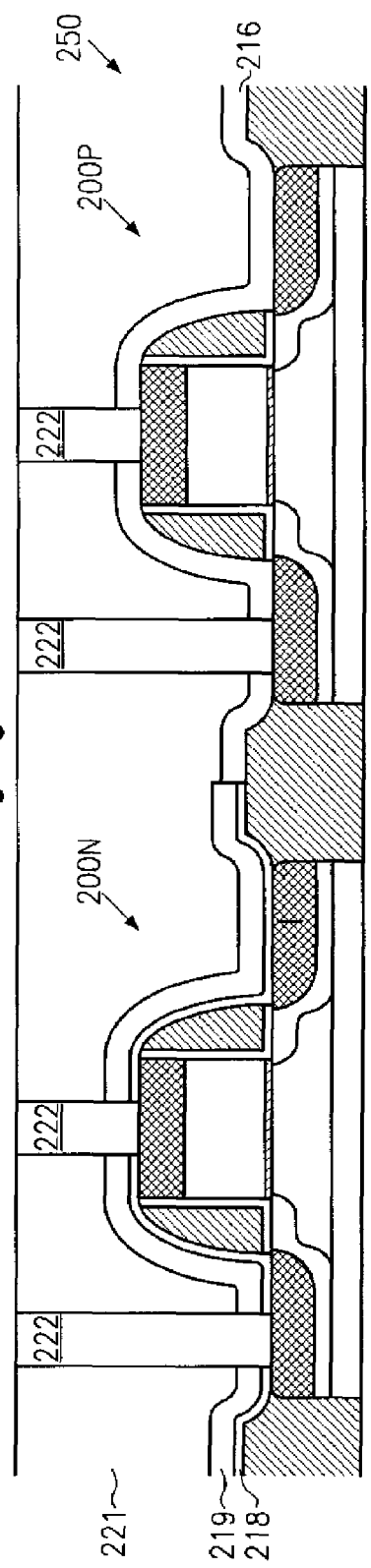

FIG. 2h schematically shows the semiconductor device 250 with an interlayer dielectric 221 formed above the first and second contact etch stop layers 216, 219, which thereby form a first dielectric layer stack, and with contact portions 222 formed in the interlayer dielectric 221 and the contact etch stop layers 219, 216 and the etch stop layer 218, which thereby form a second dielectric layer stack, in the first transistor element 200N.

A typical process flow for forming the device 250 as shown in FIG. 2h may comprise the following processes. The interlayer dielectric 221 may be deposited in the form of silicon dioxide on the basis of deposition techniques, such as PECVD from TEOS and/or sub-atmospheric CVD on the basis of TEOS and/or high density PECVD, in order to form a silicon dioxide layer reliably enclosing the first and second transistors 200N, 200P. Thereafter, the surface of the interlayer dielectric 221 may be planarized, for instance by chemical mechanical polishing and the like, and corresponding contact openings 222 may be etched on the basis of well-established etch recipes. For this purpose, a selective anisotropic etch chemistry may be used to etch through the interlayer dielectric 221 on the basis of a correspondingly designed resist mask (not shown), wherein the second contact etch stop layer 219 for the transistor 200N and the first contact etch stop layer 216 for the transistor 200P reliably stop the etch front at the gate electrodes 205 and subsequently at the drain and source regions 211. Thereafter, the etch chemistry may be changed for removing the materials of the respective contact etch stop layers 219, 216, wherein a high degree of selectivity to the underlying etch stop layer 218 in the first transistor 200N may not be necessary. After completion of the etch process, the openings 222 may be filled with an appropriate conductive material on the basis of well-established process recipes.

While in FIGS. 2a-2h, in one particular embodiment, the process is described for the device 250 to comprise a P-channel transistor having a superior performance due to an enhanced stress transfer mechanism while the corresponding N-channel transistor exhibits superior metal silicide integrity, with reference to FIGS. 3a-3g, a corresponding process flow is illustrated in which performance of an N-channel transistor is increased by directly placing a tensile contact etch stop layer thereon. In FIGS. 3a-3g, the same reference numerals are used for describing the same components except for a leading "3" instead of a leading "2" and hence any detailed description of these components is omitted.

Figure 3A:
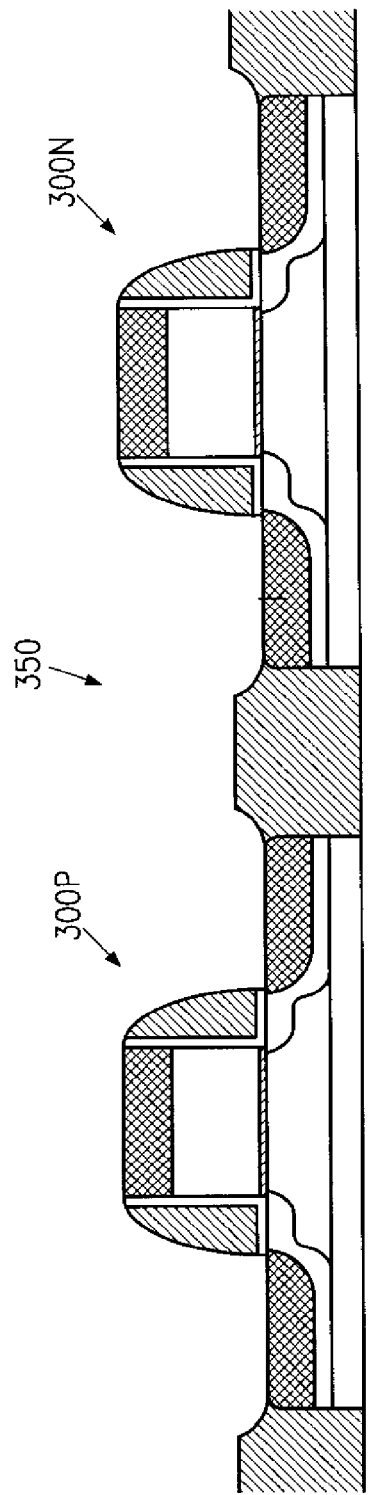

In FIG. 3a, thus, the semiconductor device 350 comprises the P-channel transistor 300P and the N-channel transistor 300N, which may have been formed in accordance with the same processes as previously described.

Figure 3B:
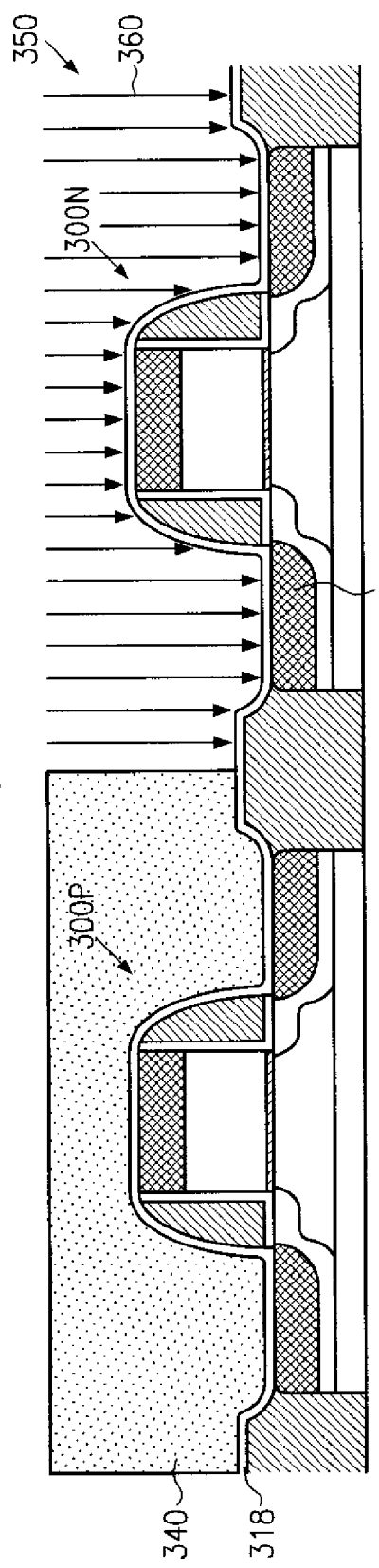

FIG. 3b illustrates the device 350 during the selective removal of the first etch stop layer 318 above the N-channel transistors 300N.

FIG. 3c schematically shows the device 350 with the first contact etch stop layer 316, wherein, contrary to the previous exemplary embodiment, the layer 316 may have a tensile intrinsic stress so as to induce a corresponding tensile strain in the N-channel transistor 300N.

FIG. 3d schematically shows the selective removal of the portion of the layer 316 with tensile stress of the P-channel transistor 300P and removal of portions of the layer 317.

Figure 3E:
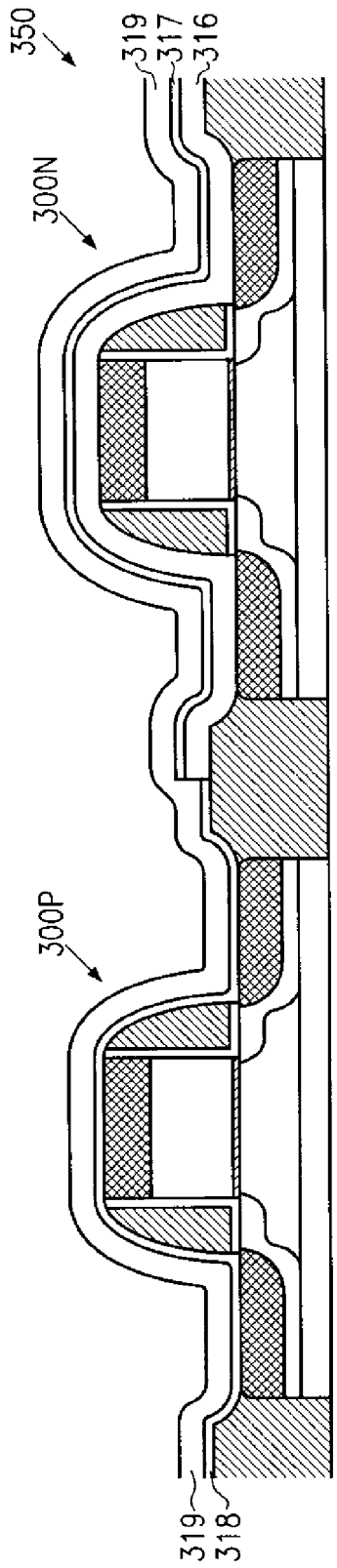

FIG. 3e schematically illustrates the semiconductor device 350 having formed thereon the second contact etch stop layer 319, which now may comprise a compressive stress.

Figure 3F:
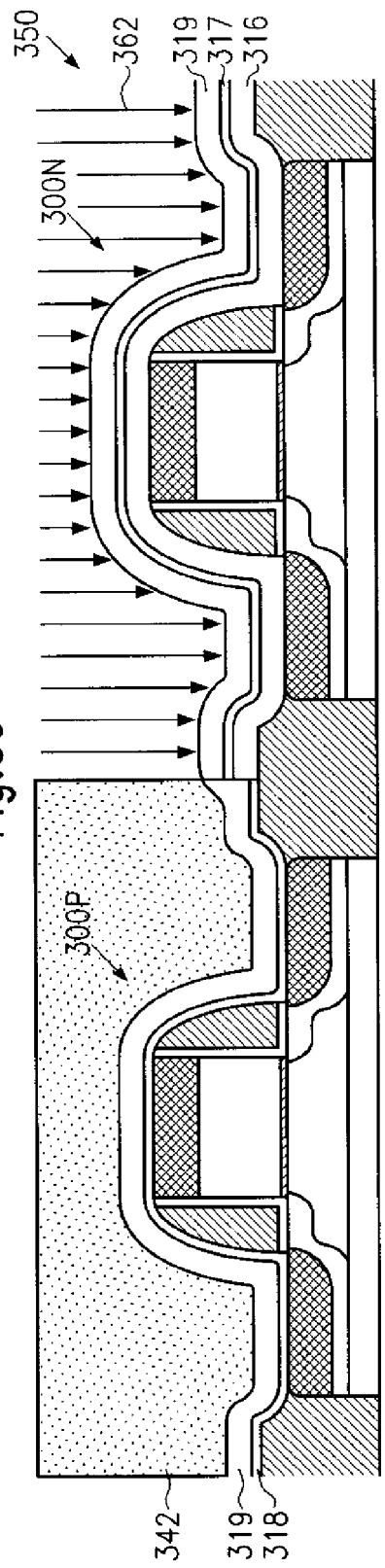

In FIG. 3f, the device 350 is subjected to the plasma-based etch process 362 for removing the exposed portion of the layer 319 having the compressive stress.

FIG. 3g finally illustrates the device 350, wherein the P-channel transistor 300P has formed thereon the layer portion 319 having the compressive stress, while the N-channel transistor 300N comprises the tensile contact etch stop layer 316 directly thereon so as to enhance performance of the transistor 300N.

With reference to FIGS. 4a-4g, further illustrative embodiments will now be described in more detail, in which a highly efficient stress transfer mechanism for both types of transistors may be provided, while a high degree of metal silicide integrity is still maintained.

In FIG. 4a, the semiconductor device 450 comprises two transistor elements 400N, 400P which may have substantially the same configuration as is previously described with reference to the transistor elements 100N, 100P, 200N, 200P and 300N, 300P and hence any detailed description of the components thereof is omitted, wherein it should be appreciated that the respective components are denoted by the same reference signs except for a leading "4" instead of a leading "3," "2" or "1." Other than in the previously described embodiments, the semiconductor device 450 comprises a liner 428 formed on the first and second transistors 400N, 400P, wherein the liner 428 comprises a first type of stress, for instance tensile or compressive, depending on process requirements. The liner 428 may, for instance, be formed of silicon nitride with a thickness of approximately 5-50 nm and with a desired magnitude of stress. Formed on the liner 428 is a first etch stop layer 418, which may be similar to the etch stop layers 118, 218 and 318 described previously. For example, the etch stop layer 418 may be comprised of silicon dioxide with a thickness in the range of approximately 5-30 nm. The liner 428 and the etch stop layer 418 may be formed in accordance with well-established process recipes, as is also described previously with respect to etch stop layers and contact etch stop layers.

FIG. 4b schematically shows the semiconductor device 450 in a further advanced manufacturing stage, in which a portion of the liner 428 and of the first etch stop layer 418 is selectively removed above the second transistor 400P on the basis of an etch process 460 and an appropriately designed etch mask 440. The etch process 460 may be designed as a two-step process for selectively removing the layer 418, for instance on the basis of diluted fluoric acid when the layer 418 is comprised of silicon dioxide, followed by a selective etch process for removing the liner 428. Due to the reduced thickness of the liner 428, and the possibility of using highly selective wet chemical etch recipes, the removal of the layer portion 428 may not unduly contribute to any material degradation in the corresponding metal silicide regions 408 and 412, similarly as is the case in the previously described embodiments with respect to the corresponding etch process 260 and 360.

FIG. 4c schematically shows the device 450 after the formation of a first contact etch stop layer 416 having a specified second type of intrinsic stress that is different from the first type of intrinsic stress created by the liner 428. For example, the liner 428 may include tensile stress, while the first contact etch stop layer 416 may have a compressive stress when the second transistor element 400P represents a P-channel transistor. In other cases, the liner 428 may include compressive stress and the contact etch stop layer 416 may include tensile stress when the first transistor 400P represents an N-channel transistor. Regarding the formation of the layers 416 and a corresponding etch stop layer 417, the same criteria apply as previously explained with respect to the corresponding components.

FIG. 4d schematically shows the device 450 during an etch process 460 on the basis of a corresponding resist mask 441 for removing a portion of the first contact etch stop layer 416 above the first transistor 400N. Hereby, the etch stop layer 418 provides a reliable stop of the etch process 460, as is also previously described.

FIG. 4e schematically shows the device 450 during a further etch process 461a, which is designed to remove the exposed portion of the first contact etch stop layer 418 on the basis of any appropriate and well-established recipe, which may be based on a wet chemical or plasma-based processes. Thus, the liner 428 may be substantially completely exposed by the etch process 461a, wherein a high degree of etch selectivity may be achieved to thereby avoid or substantially reduce any undue material degradation of the underlying metal silicide regions 408 and 412. Thereafter, the resist mask 441 may be removed, wherein advantageously a material erosion that may possibly be caused by resist strip processes may be reliably suppressed due to the presence of the liner 428.

FIG. 4f schematically shows the semiconductor device 450 having formed thereon a second contact etch stop layer 419, which has the same type of intrinsic stress as the liner 428. In one illustrative embodiment, the second contact etch stop layer 419 is formed of the same material as the liner 428 so that both layers in combination act as the second contact etch stop layer in the subsequent processing. For this purpose, the layer 419 may be deposited on the basis of well-established recipes, wherein the layer thickness may be adapted to the thickness of the liner 428 so as to substantially achieve in combination a target thickness for the second contact etch stop layer.

FIG. 4g schematically shows the device 450 during an etch process 462 on the basis of a resist mask 442 in order to remove a portion of the second contact etch stop layer 419 above the second transistor 400P.

Consequently, the first transistor 400N and the second transistor 400P are in direct contact with the respective strain-inducing layers, thereby significantly enhancing the stress transfer mechanism for both transistors. Moreover, due to the above-described process sequence, a high degree of metal silicide integrity is maintained, thereby additionally contributing to enhanced transistor performance, especially if highly scaled transistor structures are considered.

As a result, the present invention provides an enhanced technique for creating a different strain in different transistor types on the basis of correspondingly designed contact etch stop layer stacks, wherein a high degree of metal silicide integrity may be achieved. For this purpose, a sacrificial etch stop layer may be formed and may be removed on one or both transistors to allow direct contact of the strain-inducing layer with at least one transistor, wherein, in one illustrative embodiment, the sacrificial etch stop layer may be completely removed, thereby providing a significantly enhanced stress transfer mechanism.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   selectively forming a first etch stop layer above only one of a first transistor element and a second transistor element;
   forming a first contact etch stop layer above said first and second transistor elements and said first etch stop layer after selectively forming said first etch stop layer above only one of said first and second transistor elements, said first contact etch stop layer having a first specified intrinsic stress;
   selectively removing a portion of said first contact etch stop layer formed above said one of said first transistor element and said second transistor element having formed thereabove said first etch stop layer by a selective etch process using said first etch stop layer as an etch stop; and
   forming a second contact etch stop layer above said first and second transistor elements, said second contact etch stop layer having a second intrinsic stress that differs from said first intrinsic stress.

2. The method of claim 1, further comprising forming a second etch stop layer prior to forming said second contact etch stop layer and selectively removing a portion of said second contact etch stop layer above the other one of said one of said first transistor element and said second transistor element using said second etch stop layer as an etch stop.

3. The method of claim 1, wherein selectively forming said first etch stop layer comprises depositing said first etch stop layer above said first and second transistor elements, forming a first mask layer covering said one of said first transistor element and said second transistor element and removing a non-masked portion of said first etch stop layer.

4. The method of claim 1, wherein said one of said first transistor element and said second transistor element receiving said first etch stop layer is an N-channel transistor element and said first contact etch stop layer comprises compressive stress.

5. The method of claim 1, wherein said one of said first transistor element and said second transistor element receiving said first etch stop layer is a P-channel transistor element and said first contact etch stop layer comprises tensile stress.

6. A method, comprising:
   selectively forming a liner having a first type of intrinsic stress on a first transistor element while maintaining a second transistor element exposed;
   selectively forming a first etch stop layer on said liner while maintaining said second transistor element exposed;
   forming a first contact etch stop layer above said first and second transistor elements, said first contact etch stop layer having a second type of intrinsic stress other than said first type;
   selectively removing a portion of said first contact etch stop layer formed above said first transistor element using said first etch stop layer as an etch stop;

removing said first etch stop layer; and forming a second contact etch stop layer above said first and second transistor elements, said second contact etch stop layer having said first type of intrinsic stress.

7. The method of claim 6, further comprising forming a second etch stop layer prior to forming said second contact etch stop layer and selectively removing a portion of said second contact etch stop layer above said second transistor element using said second etch stop layer as an etch stop.

8. The method of claim 6, wherein selectively forming said liner and said first etch stop layer comprises depositing said liner with said first type of intrinsic stress, depositing said first etch stop layer on said liner, forming a mask layer covering said first transistor element and exposing said second transistor element and removing a non-masked portion of said liner and said first etch stop layer.

9. The method of claim 6, wherein said first transistor element is a P-channel transistor and said second transistor element is an N-channel transistor.

10. The method of claim 9, wherein said first type of intrinsic stress is a compressive stress.

11. The method of claim 6, wherein said first transistor element is an N-channel transistor and said second transistor element is a P-channel transistor.

12. The method of claim 11, wherein said first type of intrinsic stress is a tensile stress.

13. The method of claim 6, wherein removing said first etch stop layer comprises exposing said liner and forming said second contact etch stop layer above said first and second transistor elements comprises forming said second contact etch stop layer above said exposed liner.

* * * * *